(12) United States Patent
Michael et al.

(10) Patent No.: US 7,768,254 B1
(45) Date of Patent: Aug. 3, 2010

(54) SERVER POWER MEASUREMENT

(75) Inventors: Amir M. Michael, San Mateo, CA (US); Ken Krieger, Jackson, WY (US)

(73) Assignee: Exaflop LLC, Mountain View, CA (US)

( * ) Notice: Subject to any disclaimer, the term of this patent is extended or adjusted under 35 U.S.C. 154(b) by 138 days.

(21) Appl. No.: 11/877,432

(22) Filed: Oct. 23, 2007

(51) Int. Cl.
*G01R 11/32* (2006.01)
*G01R 33/07* (2006.01)

(52) U.S. Cl. .................................... 324/142; 324/117 H

(58) Field of Classification Search .................. 324/142, 324/117 H
See application file for complete search history.

(56) References Cited

U.S. PATENT DOCUMENTS

| | | | |
|---|---|---|---|
| 7,366,921 B2 * | 4/2008 | Ranganathan | 713/300 |
| 7,493,222 B2 * | 2/2009 | Bruno | 702/64 |
| 2004/0080307 A1 * | 4/2004 | Ohtsuka | 324/117 H |
| 2005/0102539 A1 * | 5/2005 | Hepner et al. | 713/300 |
| 2006/0123807 A1 * | 6/2006 | Sullivan et al. | 62/129 |

* cited by examiner

*Primary Examiner*—Amy He
(74) *Attorney, Agent, or Firm*—Fish & Richardson P.C.

(57) ABSTRACT

The subject matter of this specification can be embodied in, among other things, a system that includes a computer device. The computer device includes a power supply and a component that receives power from the power supply through a first electrical connection. The system includes a measurement adapter for measuring an electrical property of the first electrical connection. The measurement adapter is interposed within the first electrical connection between the power supply and the component. The measurement adapter is configured to draw power from a second electrical connection that is different from the first electrical connection. The measurement adapter includes a sensor for measuring the electrical property of the first electrical connection.

20 Claims, 5 Drawing Sheets

SERVER POWER MEASUREMENT

TECHNICAL FIELD

This document discusses mechanisms and techniques for measuring power drawn by multiple components of a computer device.

BACKGROUND

Power measurement devices can be installed to measure power consumed by computers, such as servers. In some systems, server power measurements are taken on the alternating current (AC) input. Measurements on the AC input reflect the power of the entire system and not individual components. In some cases, power measurement on the AC input can be inaccurate because of changing power factors and changing efficiency of the power supply as the load changes.

In certain instances, a component can include a measurement device and a communication interface, such as the Inter-Integrated Circuit ($I^2C$) bus. The measurement device and the communication interface are integrated within a voltage regulator circuit of the component. Power drawn by the integrated measurement device and communication interface can effect power measurements made and the measurements can be subject to inaccuracy as the load on the voltage regulator changes.

SUMMARY

In general, this document describes interposing a measurement adapter within an electrical connection between a power supply and a component of a computer device. The measurement adapter measures one or more electrical properties of the electrical connection for calculating power drawn by the component.

In one implementation, a system is disclosed. The system includes a computer device. The computer device includes a power supply and a component that receives power from the power supply through a first electrical connection. The system includes a measurement adapter for measuring an electrical property of the first electrical connection. The measurement adapter is interposed within the first electrical connection between the power supply and the component. The measurement adapter is configured to draw power from a second electrical connection that is different from the first electrical connection. The measurement adapter includes a sensor for measuring the electrical property of the first electrical connection.

In another implementation, a computer-implemented method is disclosed. The method includes performing a first operation at a first computer device. The first computer device comprises a first power supply and a first component that receives power from the first power supply through a first electrical connection. The method includes interposing a measurement adapter within the first electrical connection between the first power supply and the first component. The measurement adapter draws power from an adapter electrical connection that is different from the first electrical connection. The method includes measuring an electrical property of the first component while performing the first operation. The method includes storing the electrical property measurement of the first component.

In another implementation, a system is disclosed. The system includes a computer device. The computer device includes a power supply and a component that receives power from the power supply through an electrical connection. The system includes a means for interposing a measurement adapter within the electrical connection between the power supply and the component. The system includes a means for measuring an electrical property of the electrical connection from the power supply to the component where the measurement is substantially unbiased by power used to take the measurement. The system includes means for storing the electrical property measurement of the component.

The systems and techniques described here may provide one or more of the following advantages. First, a system can provide power consumption information on a component level basis. Second, component power usage can be compared for different operations to determine a preferred operation that uses less power. Third, component power usage can be compared among multiple components to determine a preferred component for performing a particular operation.

The details of one or more embodiments of the server power measurement feature are set forth in the accompanying drawings and the description below. Other features and advantages of the server power measurement feature will be apparent from the description and drawings, and from the claims.

DESCRIPTION OF DRAWINGS

Like reference symbols in the various drawings indicate like elements.

DETAILED DESCRIPTION

This document describes systems and techniques for measuring power drawn by multiple components of a computer device, such as a desktop computer, a portable computer, a server, or multiple rack mounted server computers. The components of the computer device are removably coupled to a power supply. For example, the components may include central processing units (CPUs), graphics processing units (GPUs), graphics cards, memory cards, hard drives, removable media drives, and motherboards to name a few. The system couples sensors between the computer device components and the power supply. The sensors measure electrical properties of the connections between the power supply and the components. The sensors report the measured electrical properties to a power measurement adapter that uses the measured electrical properties to perform calculations, such as power drawn by each of the components.

The measured and calculated information can be used to determined operations and components for use with the computer device that use a least amount of power. For example, one of multiple operations may be identified that uses a least amount of power when performed using a particular computer device having a particular set of components. Alternatively, one or more of a plurality of components may be identified that use a least amount of power when performing a particular operation.

Figure 1:
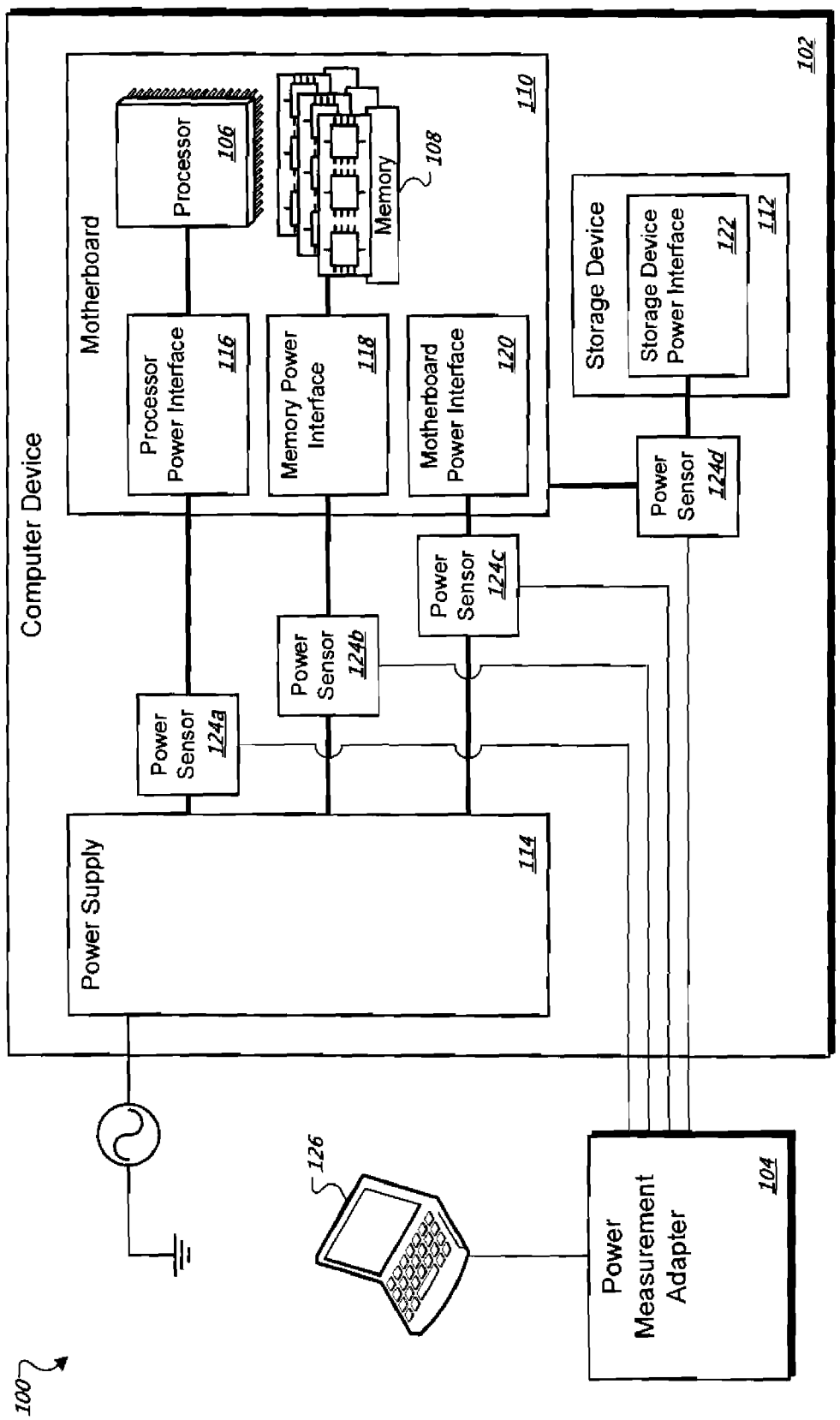
FIG. 1 is a schematic diagram showing an example of a system for measuring power drawn by one or more components of a computer device.

FIG. 1 is a schematic diagram showing an example of a system 100 for measuring power drawn by one or more components of a computer device. The system 100 includes a computer device 102 and a power measurement adapter 104. The power measurement adapter 104 measures power drawn by individual components within the computer device 102. While shown here as external to the computer device 102, in some implementations, the power measurement adapter 104 is included in or mounted with the computer device 102, such as within a storage device mount (e.g., a hard disk drive bay).

The computer device 102 includes multiple components, such as a processor 106, a memory 108, a motherboard 110, and a storage device 112. In some implementations, the computer device 102 includes multiple processors, memories, motherboards, storage devices, and/or other types of components. The processor 106, the memory 108, the motherboard 110, and the storage device 112 receive power from a power supply 114.

In some implementations, the power supply 114 converts alternating current (AC) power to direct current (DC) power for use by the components of the computer device 102. While shown here as internal to the computer device 102, in some implementations, the power supply 114 is external to the computer device 102. Each of the processor 106, the memory 108, the motherboard 110, and the storage device 112 are coupled to the power supply 114 through a removable connection, such as a processor power interface 116, a memory power interface 118, a motherboard power interface 120, and a storage device power interface 122, respectively. The power interfaces may include or provide power to voltage regulator modules for the components of the computer device 102. Voltage regulator modules condition the power input to the components through the removable power interface connections, such as by maintaining a constant voltage.

In some implementations, a removable power connection or interface is a cable connector or a plug (e.g., a Molex power connector or a Berg power connector). For example, the storage device power interface 122 may be a "male" Molex connector that inserts into a "female" Molex connector. In addition, in some implementations a removable power connection or interface is included in another connection, such as a microchip socket, a circuit board slot, a circuit board edge connector, a data cable (e.g., a Universal Serial Bus cable), or a card slot (e.g., Personal Computer Memory Card International Association CardBus or Peripheral Component Interconnect ExpressCard).

A plurality of power sensors 124a-d measure one or more electrical properties of the power connections between the power supply 114 and the processor power interface 116, the memory power interface 118, the motherboard power interface 120, and the storage device power interface 122, respectively. For example, the power sensors 124a-d can measure electric current (e.g., amperage) and electric potential difference (e.g., voltage) across the power connections. The power sensors 124a-d are in communication with the power measurement adapter 104 and send the measurements of the electrical properties to the power measurement adapter 104. The power measurement adapter 104 uses the measured electrical properties to calculate individual power drawn by each of the components of the computer device 102. The power measurement adapter 104 can output the measured electrical properties or calculations based on the measured electrical properties to an administrative computer device 126. A user can review the output at the administrative computer device 126.

In some implementations, the power measurement adapter 104 can output the measured electrical properties and/or calculations to the computer device 102. A user can review the output at the computer device 102. In some implementations, the power measurement adapter 104 can included input and output user interfaces for presenting the electrical properties and/or calculations to a user.

In some implementations, each of the power sensors 124a-d are removably coupled between an interface of the power supply 114 and the interfaces of the computer device components. For example, the power sensor 124a is removably coupled to the power supply 114 and the power sensor 124a is removably coupled to the processor power interface 116.

While shown here as included in the computer device 102, in some implementations the power sensors 124a-d are located external to the computer device 102. In some implementations, the power sensors 124a-d are located within the power measurement adapter 104.

Figure 2:
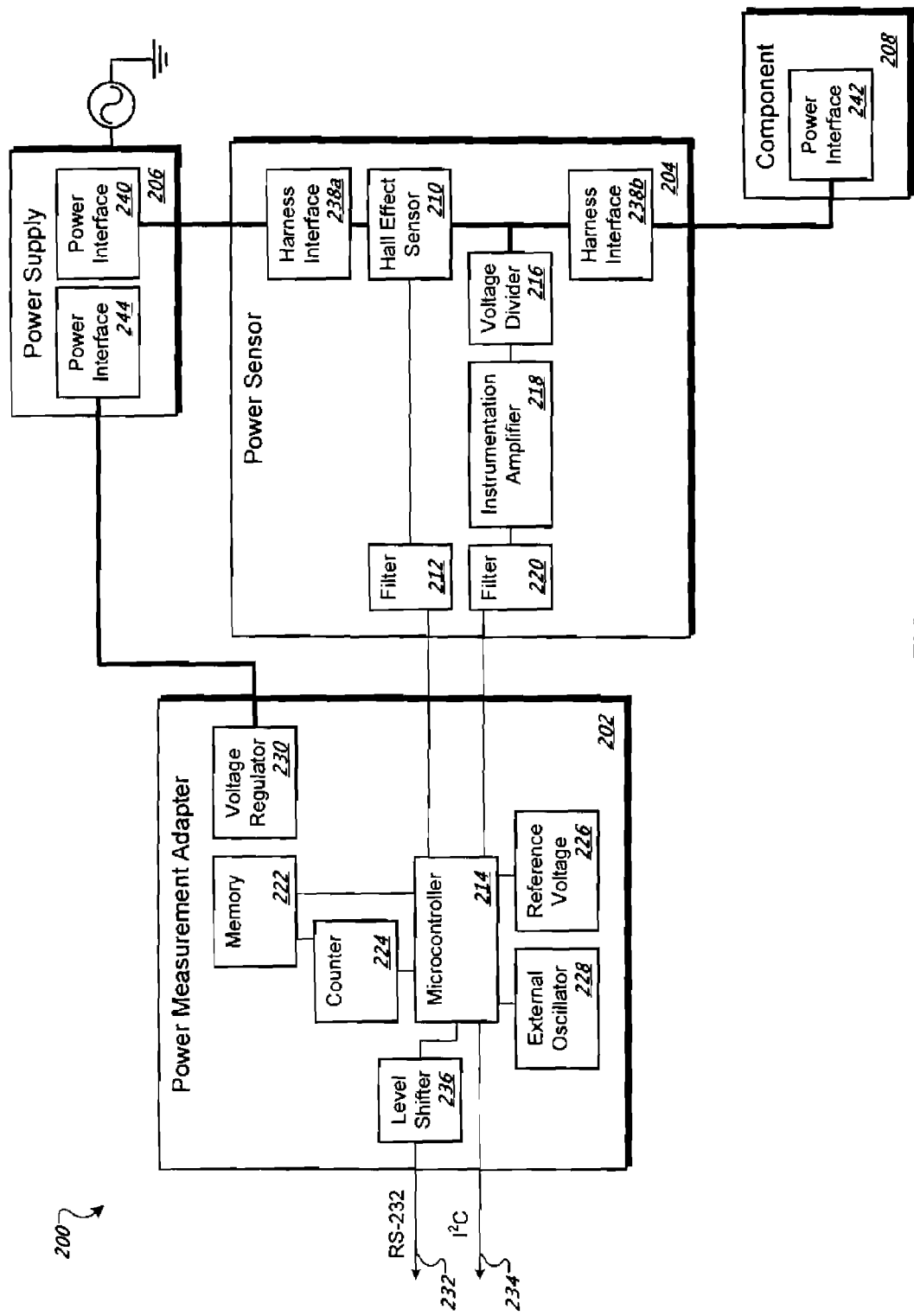
FIG. 2 is a block diagram showing an example of a system for measuring power drawn by one or more components of a computer device.

FIG. 2 is a block diagram showing an example of a system 200 for measuring power drawn by one or more components of a computer device. The system 200 includes a power measurement adapter 202, a power sensor 204, a power supply 206, and a power load such as a computer device component 208.

The power sensor 204 measures one or more electrical properties of the power connection between the power supply 206 and the computer device component 208. The power sensor 204 reports the measured electrical properties to the power measurement adapter 202.

The power measurement adapter 202 performs calculations using the measured electrical properties (e.g., to calculate power drawn based on electrical current and voltage measurements). The power measurement adapter 202 stores the calculated and/or measured data. The power measurement adapter 202 can output the calculated and/or measured data to an external sources such as the administrative computer device 126 described with respect to FIG. 1.

The power sensor 204 includes a Hall Effect sensor 210 for measuring the electrical current drawn from the power supply 206 by the computer device component 208. The Hall Effect sensor 210 is a transducer that varies an output voltage signal in response to changes in a magnetic field due to changes in a electrical current. Typically, the Hall Effect sensor 210 does not interrupt the circuit between the power supply 206 and the computer device component 208.

The voltage signal provided by the Hall Effect sensor 210 passes through a filter 212 before passing to a microcontroller 214 of the power measurement adapter 202. In some implementations, the microcontroller 214 includes an analog-to-digital converter (ADC). The microcontroller 214 receives the voltage signal at the ADC. In some implementations, the type of the Hall Effect sensor 210 is chosen so that the voltage signal level is within an acceptable range of voltage levels for the ADC within the microcontroller 214. The Hall Effect sensor 210 may be a sensor such as the "SCD20PUN" commercially available from CUI Incorporated of Tualatin, Oreg. The microcontroller 214 may be a controller such as the "dsPIC30F5011" commercially available from Microchip Technology Incorporated of Chandler, Ariz.

The filter 212 includes a capacitor that minimizes noise in the signal provided to the ADC, such as by removing particular frequencies from the voltage signal. In some implementations, the filter 212 is located as close as possible to the ADC inputs of the microcontroller 214 to minimize as much noise as is possible. The microcontroller 214 converts the analog voltage signal representing the current drawn by the computer device component 208 to digital data suitable for use in calculations performed by the microcontroller 214, such as a power calculation based on the current measurement and a voltage measurement.

The power sensor 204 also measures a voltage at the power input to the computer device component 208. The power sensor 204 includes a voltage divider 216. The voltage divider 216 changes the voltage to a level that is within the acceptable range of the ADC within the microcontroller 214. The voltage signal from the voltage divider 216 passes to an instrumentation amplifier 218. The instrumentation amplifier 218 isolates the ground plane of the computer device component 208 from the ground plane of the power measurement adapter 202. In some implementations, the isolation prevents ground loops caused by using a common ground. The instrumentation amplifier 218 can also reduce the effect of noise on the voltage measurement by only amplifying the differential voltage across the power input to the computer device component 208. The instrumentation amplifier 218 may be an amplifier such as the "AD623" commercially available from Analog Devices Incorporated of Norwood, Md.

The voltage signal from the instrumentation amplifier 218 passes to a filter 220 and on to an ADC input of the microcontroller 214. Again, the filter 220 can include a capacitor circuit that filters particular frequencies from the voltage signal provided to the ADC. In some implementations, the power sensor 204 also includes a filter capacitor between the voltage divider 216 and the instrumentation amplifier 218. The additional filter capacitor filters noise frequencies from the voltage signal provided to the instrumentation amplifier 218. In some implementations, the additional filter capacitor is included in the circuit of the voltage divider 216.

The microcontroller 214 converts the voltage signal to digital data for use in performing power calculations. Particularly, the microcontroller 214 uses the digital data representing the voltage and the previously described digital data representing the current to calculate the power drawn by the computer device component 208. For example, the microcontroller 214 may multiply the measured current by the measured voltage to calculate the power drawn by the computer device component 208.

The microcontroller 214 stores the measured current, the measured voltage, and the calculated power in a memory 222. The microcontroller 214 addresses the memory 222 using a counter 224. The counter 224 may include one or more cascaded counters such that the counters have enough outputs to address the memory space provided by the memory 222. The microcontroller 214 sends a command to the counter 224 to increment the address output of the counter 224. The counter 224 provides the new incremented address to the memory 222. The microcontroller 214 then sends the data associated with the new address to the memory 222 (e.g., a measured current, a measured voltage, or a calculated power). The memory 222 stores the received data in the memory location identified by the new address. The memory 222 may be a memory such as the "CY62148ELL-45ZSKI" SRAM (static random access memory) commercially available from Cypress Semiconductor Corporation of San Jose, Calif. The counter 224 may include two counters such as the "CD74HC4040" commercially available from Texas Instruments Incorporated of Dallas, Tex.

The power measurement adapter 202 includes a reference voltage 226 and an external oscillator 228. The reference voltage 226 sets the reference voltage of the ADC within the microcontroller 214. The external oscillator 228 is a crystal oscillator that provides clocking or time keeping for the microcontroller 214. The reference voltage 226 may be a reference such as the "LM4050AIM3-2.5" commercially available from National Semiconductor Corporation of Santa Clara, Calif. The external oscillator 228 may be an oscillator such as the "ECS-73-20-5P-TR" commercially available from ECS Incorporated International of Olathe, Kans.

The power measurement adapter 202 includes a voltage regulator 230. The voltage regulator 230 conditions power received from the power supply 206, such as by maintaining a particular constant voltage. The voltage regulator 230 provides power to the modules within the power measurement adapter 202, such as the microcontroller 214, the memory 222, and the counter 224. The voltage regulator 230 can also provide power to external modules, such as the Hall Effect sensor 210. The voltage regulator 230 may include a regulator such as the "µA7805CKTER" commercially available from Texas Instruments Incorporated.

In some implementations, the voltage regulator 230 can provide power to the computer device component 208. For example, the power measurement adapter 202 may isolate a power usage contribution due to a component, such as the storage device 112 of FIG. 1, that indirectly receives power through another component, such as the motherboard 110, by providing power to the component itself. The voltage regulator 230 may include a power converter such as the "SIL06C-12ADJ-V" point-of-load commercially available from Artesyn Technologies of Carlsbad, Calif.

The power measurement adapter 202 communicates with external devices, such as the administrative computer device 126 of FIG. 1, using a serial data connection 232 and a management protocol connection 234. In some implementations, the serial data connection 232 is an "RS-232" serial port. The serial data connection 232 includes a level shifter 236. The level shifter 236 adjusts the transmit and receive voltage levels within the serial data connection 232 to appropriate ranges for "RS-232" communication. The level shifter 236 may be a "MAX232IDWR" commercially available from Texas Instruments Incorporated.

In some implementations, the management protocol connection 234 is a port for communicating using an I$^2$C bus. The power measurement adapter 202 may exchange measurement and calculation data using the serial data connection 232 and/or the management protocol connection 234. The power measurement adapter 202 can also be configured using the serial data connection 232 and/or the management protocol connection 234. For example, the administrative computer device 126 of FIG. 1 can send a firmware update to the power measurement adapter 202 to change the power calculation equation (e.g., the power equation may be modified to account for a change to the voltage divider 216).

In some implementations, the power sensor 204 includes a harness for connecting to the power supply 206 and the computer device component 208, such as harness interfaces 238a-b. The harness interfaces 238a-b can be, for example, a cable harness for connecting to computer device components. The harness interface 238a connects to a power interface 240 of the power supply 206. The harness interface 238b connects to a power interface 242 of the computer device component 208. The power supply 206 also includes a power interface 244 that provides power to the voltage regulator 230. In some implementations, the harness interfaces 238a-b, the power interface 240, and the power interface 242 include plugs, connectors, sockets, slots, or other removable connections that allow a user to connect and disconnect the power sensor 204.

In some implementations, the power measurement adapter 202 includes the power sensor 204. For example, the power measurement adapter 202 may have a circuit board that includes the power sensor 204. The harness interfaces 238a-b provide connections from the combined adapter and sensor to the power supply 206 and the computer device component 208.

Figure 3A:
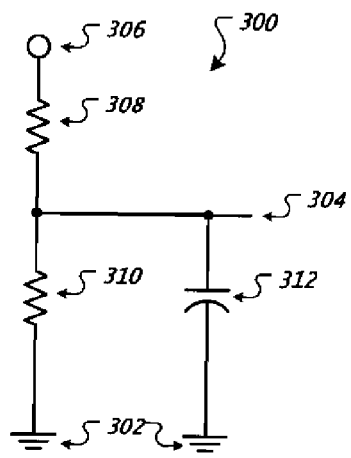
FIG. 3A is an electrical diagram showing an example of a voltage divider circuit.

FIG. 3A is an electrical diagram showing an example of a voltage divider circuit 300. The voltage divider circuit 300 includes multiple connections 302 to ground, a connection 304 to an instrumentation amplifier, and a connection 306 to the voltage being measured. The voltage divider circuit 300 changes the voltage received at a computer device component, such as the computer device component 208, to a level that is within the input range of a corresponding instrumentation amplifier, such as the instrumentation amplifier 218. For example, where the maximum allowed input voltage of the instrumentation amplifier is 2.5 volts (V), a 12.0V power supplied to a component from a power supply may be divided using a first resistor 308 having a resistance of 5.1 kiloohms (KΩ) and a second resistor 310 having a resistance of 1.0 KΩ. The inputs of the instrumentation amplifier are placed across the second resistor 310 and the power for the instrumentation amplifier is connected to the ground of a reference voltage circuit, such as the reference voltage 226.

The voltage divider circuit 300 also includes a capacitor 312. The capacitor 312 filters noise frequencies in the voltage signal provided to the instrumentation amplifier.

Figure 3B:
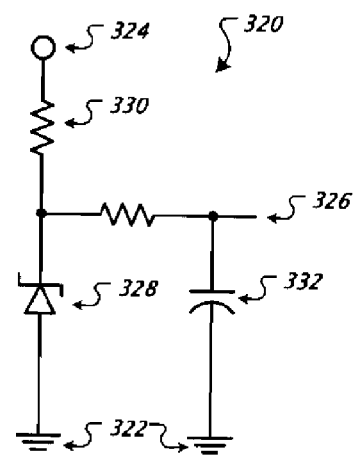
FIG. 3B is an electrical diagram showing an example of a reference voltage circuit.

FIG. 3B is an electrical diagram showing an example of a reference voltage circuit 320. The reference voltage circuit 320 includes multiple connections 322 to ground, a connection 324 to an input voltage, and a connection 326 to a reference voltage input of a microcontroller. The reference voltage circuit 320 includes a fly back zener diode 328. The fly back zener diode 328 generates a reference voltage without biasing resistors. A resistor 330 represents the circuit used to create the reference voltage. The resistance of the resistor 330 is chosen to be the difference between the voltages at the connection 324 and the connection 326 divided by the current through the fly back zener diode 328. For example, where the input voltage at the connection 324 is 5.0V, the reference voltage at the connection 326 is 2.5V, and the current through the fly back zener diode 328 is 5.0 milliamperes (mA) the resistor 330 has a resistance of about 500.00Ω. In some implementations, a 470.00 resistor may be used for the resistor 330.

The reference voltage circuit 320 also includes a capacitor 332. The capacitor 332 filters noise frequencies in the voltage signal provided to the reference voltage input of the microcontroller.

Figure 3C:
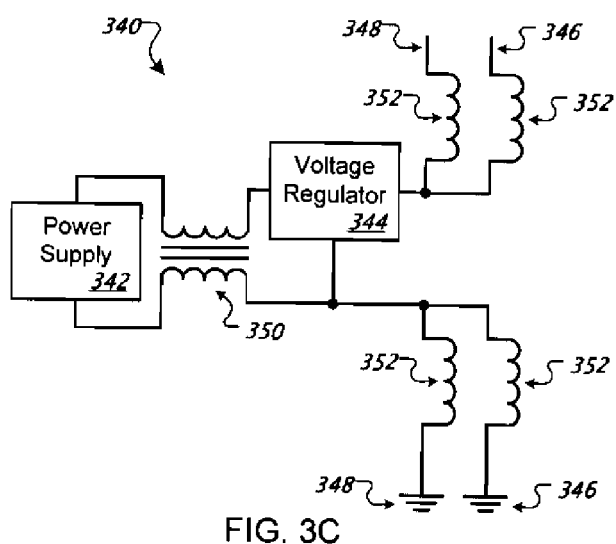
FIG. 3C is an electrical diagram showing an example of a power and ground circuit.

FIG. 3C is an electrical diagram showing an example of a power and ground circuit 340. The power and ground circuit 340 includes a power supply 342 and a voltage regulator 344. The power and ground circuit 340 has an analog power and ground plane 346 as well as a digital power and ground plane 348. The power supply 342 provides power to the voltage regulator 344. The voltage regulator 344 conditions the voltage to a particular constant value. The analog power and ground plane 346 is separated from the digital power and ground plane 348 by a common mode ferrite bead 350 and multiple ferrite beads 352. The common mode ferrite bead 350 may be a bead such as the "2744051447" bead commercially available from Fair-Rite Products Corporation of Wallkill, N.Y. The ferrite beads 352 may be beads such as the "2508053017Y3" commercially available from Fair-Rite Products Corporation.

Figure 3D:
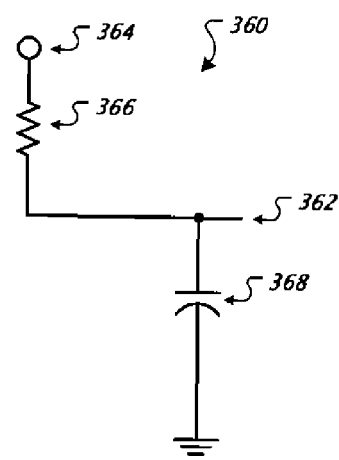
FIG. 3D is an electrical diagram showing an example of a filter capacitor circuit.

FIG. 3D is an electrical diagram showing an example of a filter capacitor circuit 360. The filter capacitor circuit 360 filters particular frequencies containing noise from the signal provided to an ADC of a microcontroller. The filter capacitor circuit 360 includes a connection 362 to the ADC input of the microcontroller and a connection 364 to the output of an instrumentation amplifier or a Hall Effect sensor. The filter capacitor circuit 360 includes a resistor 366, and a capacitor 368. A resistance for the resistor may be chosen together with a capacitance for the capacitor 368 to achieve a particular cutoff frequency. The cutoff frequency may be calculated by determining the inverse of the product of two, the constant Pi ($\pi$), the resistance, and the capacitance. For example, where the resistance of the resistor 366 is 0.1 KΩ, and the capacitance of the capacitor 368 is 0.01 microfarads (µF) the cutoff frequency is 159.2 kilohertz (kHz). In some implementations, the resistor 366 and the capacitor 368 are placed as close as possible to the ADC input to reduce noise in the ADC measurements.

Figure 4:
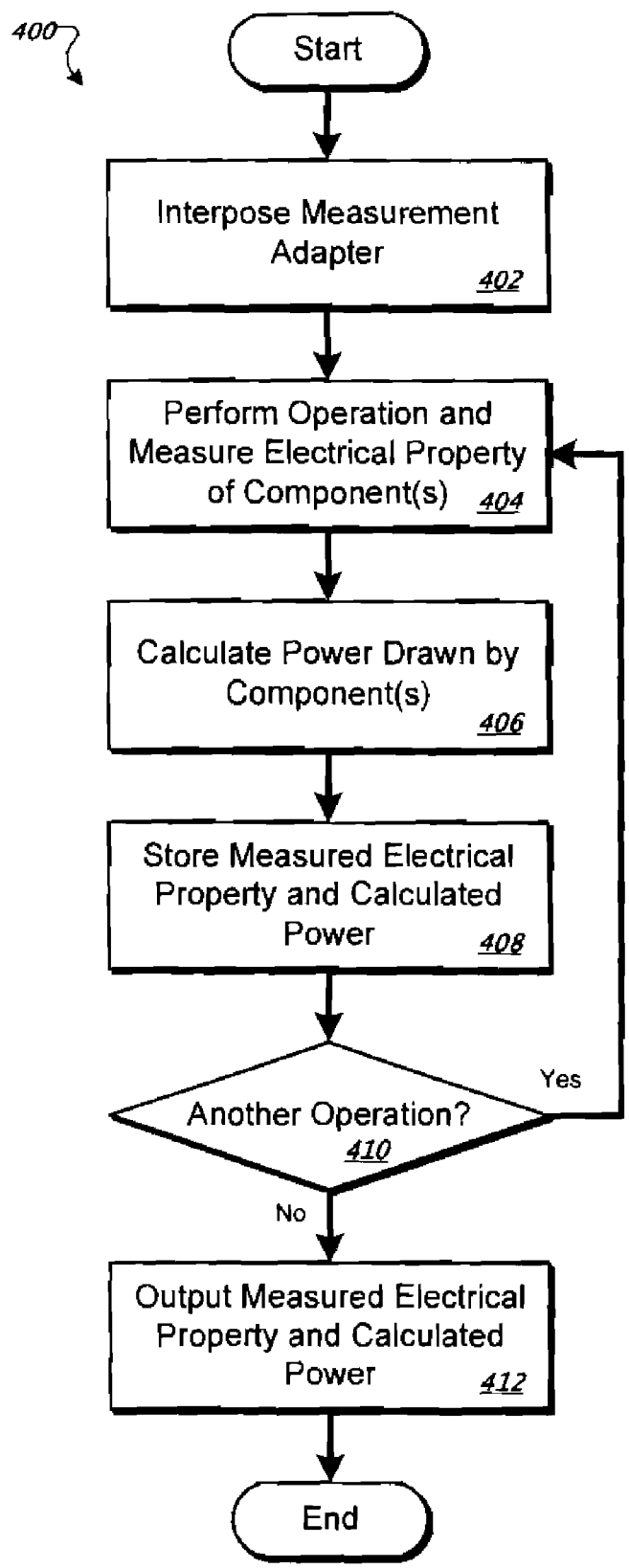
FIG. 4 is a flow chart showing an example of a process for measuring power drawn by one or more components of a computer device.

FIG. 4 is a flow chart showing an example of a process 400 for measuring power drawn by one or more components of a computer device. The process 400 may be performed, for example, by a system such as the systems 100 and 200. For clarity of presentation, the description that follows uses the systems 100 and 200 as the basis of an example for describing the process 400. However, another system, or combination of systems, may be used to perform the process 400.

The process 400 begins with interposing (402) a measurement adapter between an electrical connection from a power supply to a component of a computer device. For example, the power measurement adapter 202 and the power sensor 204 are interposed between the connection from the power supply 206 to the computer device component 208.

The process 400 performs an operation and measures (404) an electrical property of the component. For example, the computer device component 208 can perform an operation, such as performing an instruction set at a processor and reading from or writing to a memory or a storage device. The power sensor 204 converts an electrical current in the connection to a voltage signal using the Hall Effect sensor 210. The power sensor 204 divides an electrical potential difference in the connection using the voltage divider 216. The power measurement adapter 202 receives the converted current signal and the divided voltage from the power sensor 204. The power measurement adapter 202 performs an analog to digital conversion on the signals to generate a measurement of the current and voltage in the connection from the power supply 206 to the computer device component 208.

The process 400 calculates (406) a power drawn by the component. For example, the power measurement adapter 202 includes the microcontroller 214 that calculates a power drawn based on the current and voltage measured at the connection.

The process 400 stores the measured electrical property and the calculated power drawn. For example, the microcontroller 214 stores the measured and calculated data in the memory 222.

If there is another operation to perform (410), then the process 400 again performs an operation and measures (404) the electrical property of the component. In some implementations, the process 400 performs an operation different than the operation previously performed. Alternatively, the process 400 can perform the same operation again.

If there are no additional operations to perform (410), then the process 400 outputs the measured electrical property and the calculated power drawn. For example, the power measurement adapter 202 can output the measured and calculated data to a device, such as the administrative computer device 126, through the serial data connection 232 and/or the management protocol connection 234.

In some implementations, the power measurement adapter 202 and/or the administrative computer device 126 compare a first calculated power for a particular component while performing a first operation and a second calculated power for the component while performing a second operation. The power measurement adapter 202 and/or the administrative computer device 126 can use the comparison to determine a preferred operation to perform using the component. For example, the power drawn by the processor 106 may be calculated for a first processor instruction set and a second processor instruction set. The administrative computer device 126 may compare the power drawn by the processor 106 during the first instruction set and the second instruction set to determine that the processor 106 draws more power while performing the second instruction set. The administrative computer device 126 identifies the first instruction set as a preferred operation for the processor 106 due to the low power usage.

In some implementations, the administrative computer device 126 compares two or more power usage calculations for a component, such as the storage device 112, based on measurements made while the storage device 112 performs the same operation. The storage device 112 may draw more power while performing an operation during a first time interval than it does while performing the same operation during a different time interval. For example, if the storage device 112 includes a hard drive that spins up or moves a read/write head while performing the operation, the power drawn can be greater than the power drawn while performing the same operation during a different time interval where the drive does not spin up or move a read/write head.

In some implementations, the administrative computer device 126 compares power usage calculations for multiple components, such as a first processor and a second processor, that perform the same operation. The components may be of different types (e.g., different brands and/or architectures) or of the same type. In some implementations, the first processor may be more efficient at performing the operation than the second processor type or a second processor of the same type that has, for example, a manufacturing defect. Correspondingly, the first processor uses draws less power when performing the operation than the second processor. The administrative computer device 126 determines that the first processor is a preferred processor for performing the operation based on the comparison of the power drawn.

Figure 5:
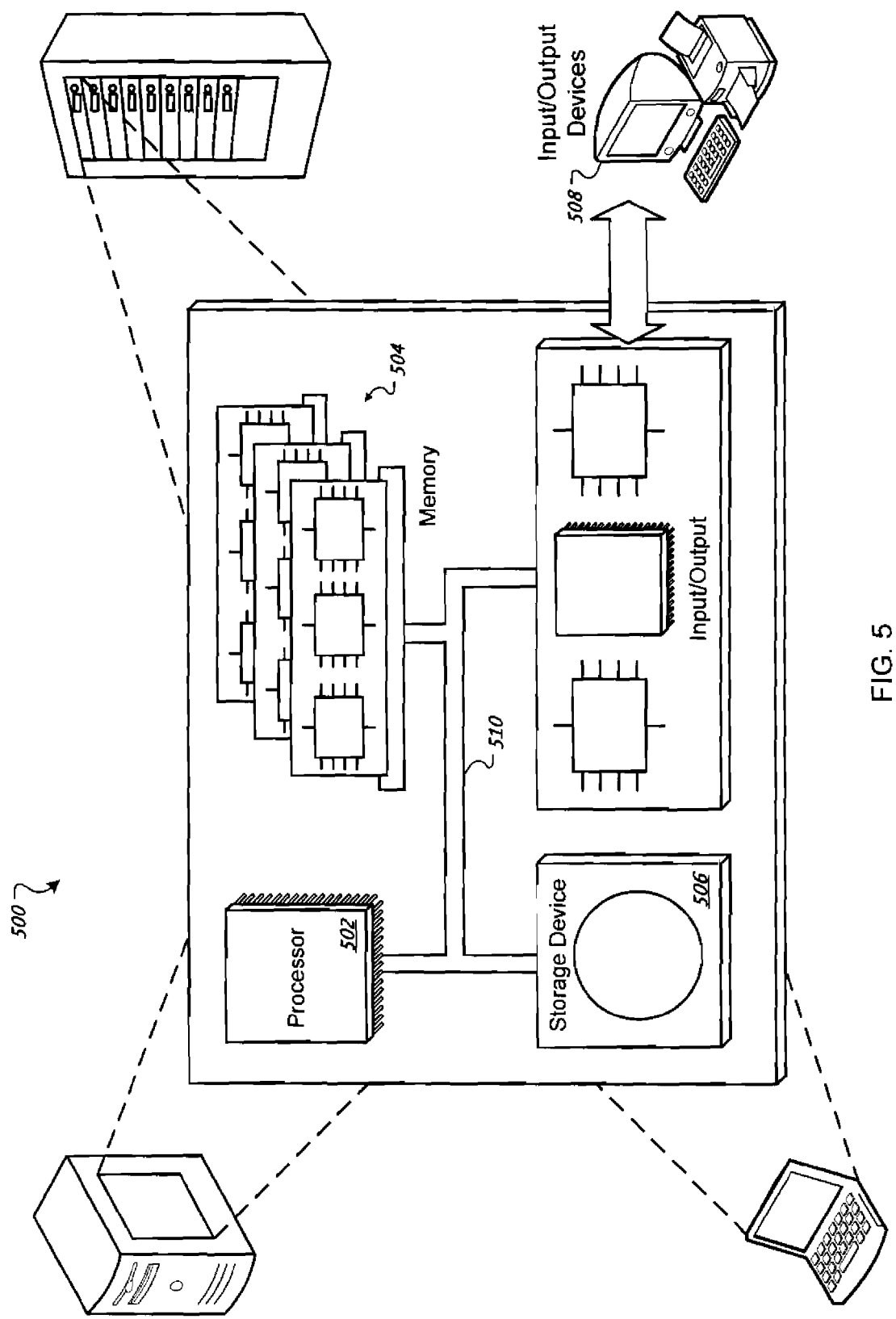
FIG. 5 is a schematic diagram showing an example of a generic computing system that can be used in connection with computer-implemented methods described in this document.

FIG. 5 is a schematic diagram of a generic computing system 500. The generic computing system 500 can be used for the operations described in association with any of the computer-implement methods described previously, according to one implementation. The generic computing system 500 includes a processor 502, a memory 504, a storage device 506, and an input/output device 508. Each of the processor 502, the memory 504, the storage device 506, and the input/output device 508 are interconnected using a system bus 510. The processor 502 is capable of processing instructions for execution within the generic computing system 500. In one implementation, the processor 502 is a single-threaded processor. In another implementation, the processor 502 is a multi-threaded processor. The processor 502 is capable of processing instructions stored in the memory 504 or on the storage device 506 to display graphical information for a user interface on the input/output device 508.

The memory 504 stores information within the generic computing system 500. In one implementation, the memory 504 is a computer-readable medium. In one implementation, the memory 504 is a volatile memory unit. In another implementation, the memory 504 is a non-volatile memory unit.

The storage device 506 is capable of providing mass storage for the generic computing system 500. In one implementation, the storage device 506 is a computer-readable medium. In various different implementations, the storage device 506 may be a floppy disk device, a hard disk device, an optical disk device, or a tape device.

The input/output device 508 provides input/output operations for the generic computing system 500. In one implementation, the input/output device 508 includes a keyboard and/or pointing device. In another implementation, the input/output device 508 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

Although a few implementations have been described in detail above, other modifications are possible. For example, the power measurement adapter 104 may be included in the computer device 102 and/or the power sensor 204 may be included in the power measurement adapter 202.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A system, comprising:
    a plurality of computer devices, each computer device comprising a power supply that converts alternating power to direct current power and one or more computer sub-systems that receive the direct current power from the power supply through electrical connections that correspond to the computer sub-systems;
    a plurality of measurement adapters each corresponding to one of the computer devices, where each measurement adapter measures electrical properties associated with the respective electrical connections of the corresponding computer device while the corresponding computer device performs an operation, and wherein:
        each measurement adapter is interposed within the electrical connections of the corresponding computer device between the power supply and the computer sub-systems,
        each measurement adapter is configured to draw power from a second electrical connection that is different from the electrical connections of the corresponding computer device, and
        each measurement adapter comprises sensors corresponding to the electrical connections to measure the electrical property associated with the respective electrical connections; and
    an administrative device in communication with the computing devices over a network, wherein the administrative device is programmed to select one of the measurement adapters and to record information about the electrical properties associated with the computer sub-systems that correspond to the selected measurement adapter and to use the recorded information to adjust how the computing devices perform the operation.

2. The system of claim 1, wherein the administrative device is programmed to compare a first calculated power while performing a first operation with the computer device and a second calculated power while performing a second operation with the computer device, and using the comparison to determine a preferred operation to perform on the computer device.

3. The system of claim 1, wherein each of the sensors comprise an electrical current sensor, and wherein the electrical property comprises an electrical current.

4. The system of claim 3, wherein the electrical current sensor comprises a Hall Effect sensor.

5. The system of claim 1, wherein each of the sensors comprise an electrical potential difference sensor, and wherein the electrical property comprises an electrical potential difference.

6. The system of claim 1, wherein each of the measurement adapters comprise a microcontroller having an analog-to-digital converter to convert an analog signal from the sensor into a digital signal.

7. The system of claim 6, wherein each of the measurement adapters comprise a memory to store the digital signal converted by the microcontroller.

8. The system of claim 1, wherein the measurement adapters are configured to be mounted in a storage device mounting location within the respective computer device.

9. The system of claim 1, wherein each of the measurement adapters comprise a first interface to connect to a second interface of the power supply and a third interface to connect to a fourth interface of the corresponding computer sub-system.

10. A computer-implemented method, comprising:
    performing a first operation at a first computer device, wherein the first computer device comprises a first power supply and a first component that receives direct current power from the first power supply through a first electrical connection;
    interposing a measurement adapter within the first electrical connection between the first power supply and the first component, wherein the measurement adapter draws power from an adapter electrical connection that is different from the first electrical connection;
    measuring, with the measurement adapter, an electrical property associated with the first component while performing the first operation during a first time interval;
    storing the measured electrical property measurement associated with the first component; and
    using an administrative device that is connected to a plurality of computer devices by a network to select the measurement adapter from among a plurality of measurement adapters and use the stored measured electrical property to adjust what operations are performed by the first computer device.

11. The method of claim 10, further comprising performing the first operation at a second computer device, wherein the second computer device comprises a second power supply and a second component that receives direct current power from the second power supply through a second electrical connection;
    interposing the measurement adapter within the second electrical connection between the second power supply and the second component; and
    measuring an electrical property associated with the second component while performing the first operation.

12. The method of claim 11, further comprising determining a preferred component from among the first component and the second component to perform the first operation wherein the determination is based on a comparison of the electrical property measurements associated with the first component and the second component, and subsequently performing the first operation using the determined preferred component.

13. The method of claim 10, further comprising measuring the electrical property associated with the first component while performing a second operation at the first computer device.

14. The method of claim 13, further comprising determining a preferred operation from among the first operation and the second operation to use with the first component wherein the determination is based on a comparison of the electrical property measurements associated with the first component while performing the first operation and the second operation, and subsequently performing the determined preferred operation using the first component.

15. The method of claim 10, further comprising measuring the electrical property associated with the first component at the first computer device while repeating the first operation during a second time interval that is different than the first time interval.

16. The method of claim 15, further comprising determining a preferred time interval from among the first time interval and the second time interval for performing the first operation wherein the determination is based on a comparison of the electrical property measurements associated with the first component while performing the first operation during the first time interval and the second time interval, and subsequently performing the first operation during the determined preferred time interval.

17. The method of claim 10, wherein measuring an electrical property associated with the first component comprises measuring an electrical current associated with the first component.

18. The method of claim 10, wherein measuring an electrical property associated with the first component comprises measuring an electrical potential difference associated with the first component.

19. A system, comprising:
a computer device, wherein the computer device comprises a power supply and a component that receives direct current power from the power supply through an electrical connection while the component performs an operation;
means for interposing one or more electrical sensors within the electrical connection between the power supply and the component;
a measurement adapter arranged to measure an electrical property associated with the electrical connection from the power supply to the component, wherein the measurement is substantially unbiased by power used to take the measurement;
a computer memory to store the measured electrical property; and
an administrative device, in communication with a plurality of computing devices, including the computer device, over a network, each computing device having a measurement adapter, and wherein the administrative device is programmed to select one of the measurement adapters and to record information about the electrical property associated with the electrical connection that corresponds to the selected measurement adapter and to use the recorded information to adjust how the computing devices perform the operation.

20. The system of claim 19, wherein the measurement adapter further comprises:
an electrical current sensor; and
an electrical potential difference sensor.

* * * * *